United States Patent [19]

Haag et al.

[11] 4,293,925
[45] Oct. 6, 1981

[54] APPARATUS AND METHOD FOR INDICATING A MINIMUM DEGREE OF ACTIVITY OF DIGITAL SIGNALS

[75] Inventors: George A. Haag, Colorado Spring; O. Douglas Fogg, Loveland; Gordon A. Greenley, Colorado Spring; Steve A. Shepard, Colorado Spring, all of Colo.; F. Duncan Terry, Meridan, Id.

[73] Assignee: Hewlett-Packard Company, Palo Alto, Calif.

[21] Appl. No.: 43,987

[22] Filed: May 31, 1979

Related U.S. Application Data

[60] Division of Ser. No. 828,138, Aug. 29, 1977, abandoned, which is a continuation of Ser. No. 75,787, Sep. 17, 1979, abandoned, which is a continuation of Ser. No. 210,462, Nov. 25, 1980.

[51] Int. Cl.³ ............................ G06F 3/14; G06F 7/02
[52] U.S. Cl. ................................................. 364/900
[58] Field of Search ............ 364/900 MS File; 371/4, 371/24, 50; 340/747, 802

[56] References Cited

U.S. PATENT DOCUMENTS

| | | | |
|---|---|---|---|
| 3,075,175 | 1/1963 | Lourie | 371/50 |
| 3,311,886 | 3/1967 | Herman et al. | 364/900 |
| 3,866,185 | 2/1975 | Etra et al. | 364/900 |
| 3,902,476 | 9/1975 | Hileman | 340/747 |
| 3,922,666 | 11/1975 | Inami | 340/802 |
| 4,040,025 | 8/1977 | Morrill, Jr. et al. | 364/900 |

Primary Examiner—Harvey E. Springborn
Attorney, Agent, or Firm—Edward L. Miller

[57] ABSTRACT

A general purpose logic state analyzer selectively stores, formats and displays a digital signal representing a sequence of data states input thereto and provides a graphical display of the stored data states and a count of selected events occurring intermediate to the occurrence of the data states stored. Selective storage of the input data states is provided by comparing the input data states to a preselected sequence of first qualifier state conditions and enabling the storage of input data states in response to the satisfaction of the preselected sequence. Storage is further qualified by storing only data states which individually meet one of a preselected set of second qualifier state conditions. Selective formatting of the stored data states is provided by converting the stored data states in response to selectable assignments of contiguous sets of bits of each stored data state to logical fields, a selectable concatenation of the logical fields, and to radicies selected for each of the respective logical fields. The converted stored data states can be displayed as a formatted listing or as a graphical display. In the graphical display the stored data bits corresponding to a selected logical field are interpreted as a binary magnitude and plotted as the ordinate and the chronological storage location is plotted as the ordinate and the chronological storage location is plotted as the abscissa on a cartesian coordinate system. A count of selected events is obtained from the contents of a binary counter and stored in a second memory in parallel with the storing of each data state. This counter can be incremented selectively in response to either an internal clock or in response to the detection of an input data state satisfying a selected count-qualifier state condition.

4 Claims, 16 Drawing Figures

---------FORMAT SPECIFICATION_____TRACE-COMPLETE_____

CLOCK SLOPE [+]
(+,-)

| | POD PROBE | POD4 7------0 | POD3 7------0 | POD2 7------0 | POD1 7------0 |
|---|---|---|---|---|---|
| LABEL ASSIGNMENT (A,B,C,D,E,F,X) | | AAAAAAAA | AAAAAAAA | DDDDDDDD | XXXXXXXF |

ACTIVE CHANNELS

LABEL
LOGIC POLARITY    A   D   F
(+,-)            [+] [+] [-]
NUMERICAL BASE
(BIN,OCT,DEC,HEX) [HEX][HEX][BIN]         [====] DESIGNATES A
                                                  SELECTABLE
                                                  ENTRY FIELD

FIGURE 1

---------TRACE SPECIFICATION_____TRACE-COMPLETE_____

| | LABEL BASE | A HEX | D HEX | F BIN | OCCUR DEC |
|---|---|---|---|---|---|
| FIND IN SEQUENCE | | 03CF | XX | X | 00002 |
| THEN | | 03E2 | XX | X | 00003 |
| THEN | | 00E1 | XX | X | 00001 |
| [START] TRACE | | 03E3 | XX | X | 00001 |
| SEQ RESTART [ON] | 03E4 | XX | X | | |

TRACE
[ONLY STATE]  03E1   XX   X   00001

COUNT [STATE]  03E1   XX   X

FIGURE 2

-----------TRACE LIST_____TRACE-COMPLETE_____

| | LABEL BASE | A HEX | D HEX | F HEX | STATE COUNT DEC |
|---|---|---|---|---|---|
| SEQUENCE | | 03CF | 5D | 0 | [REL] |
| SEQUENCE | | 03E2 | A2 | 0 | |
| SEQUENCE | | 00E1 | C6 | 0 | 2 |
| START | | 03E3 | 82 | 0 | 3 |
| +01 | | 03E3 | E1 | 0 | 1 |
| +02 | | 03E3 | E5 | 0 | 1 |
| +03 | | 03E4 | 82 | 0 | 1 |
| +04 | | 03E4 | 03 | 0 | 1 |
| +05 | | 03E4 | 47 | 0 | 1 |
| +06 | | 03E1 | A2 | 0 | 1 |
| +07 | | 03E1 | 1D | 0 | 1 |
| +08 | | 03E1 | 5D | 0 | 1 |
| +09 | | 03CE | 5D | 0 | 1 |
| +10 | | 03CE | 44 | 0 | 1 |
| +11 | | 03E2 | A2 | 0 | 1 |
| +12 | | 03E2 | C2 | 0 | 1 |
| +13 | | 03E2 | C6 | 0 | 1 |
| +14 | | 00E1 | C6 | 0 | 1 |
| +15 | | 03E3 | 82 | 0 | 1 |
| +16 | | 03E3 | E1 | 0 | 1 |

FIGURE 3

```
_____TRACE COMPARE_____COMPARED TRACE-COMPLETE_____
   LABEL      A     D    F    COMPARED
   BASE      HEX   HEX  BIN   TRACE MODE
                                 CSTOPS
SEQUENCE...0000...00...0...
SEQUENCE...0000   00   0
SEQUENCE   0000   00   0
   START    0000   00   0
    +01  ...0000...00...0...
    +02     0000   00   0
    +03     0000   00   0
    +04     0000   00   0
    +05  ...0000...00...0...
    +06     0000   00   0
    +07     0000   00   0
    +08     0000   00   0
    +09  ...0000...00...0...
    +10     0000   00   0
    +11     0000   00   0
    +12     0000   00   0
    +13  ...0000...00...0...
    +14     0000   00   0
    +15     0000   00   0
    +16     0000   00   0
```

APPARATUS AND METHOD FOR INDICATING A MINIMUM DEGREE OF ACTIVITY OF DIGITAL SIGNALS

CROSS REFERENCE TO RELATED APPLICATIONS

This application is a division of an earlier filed copending application of the same inventors and assignee, Ser. No. 828,138, filed Aug. 29, 1977, abandoned in favor of a continuing application Ser. No. 075,787 filed on Sept. 17, 1979, which in turn was abandoned in favor of a continuing application Ser. No. 210,462 filed on Nov. 25, 1980.

The subject matter of the present patent application is related to copending U.S. patent application No. 672,226 entitled LOGIC STATE ANALYZER filed Mar. 3, 1976, by Justin S. Morrill, Jr. et al., now U.S. Pat. No. 4,040,025 related to copending U.S. patent application No. 743,188 entitled DIGITAL PATTERN TRIGGERING CIRCUIT filed Nov. 19, 1976, by William A. Farnbach, now U.S. Pat. No. 4,100,532. These patents are expressly incorporated by reference.

BACKGROUND AND SUMMARY

Prior art logic state analyzer displays have merely provided formatted tabular listings or certain vector mappings. None of these displays make it easy to detect a channel or input signal that is apparently inactive, say, because a clip lead from a probe pod to the circuit under test has come loose. Another cause of inactivity might be a genuine circuit failure.

The reason that none of the prior art displays made it easy to spot an inactive signal is that they generally involve some sort of encoding such as BCD, BCO or hexadecimal. A single unchanging bit in the uncoded value merely prevents the coded value from assuming certain values, not from changing at all. Since an incorrect change is still a change an inactive signal does not readily reveal itself through inspection by the user.

Even in a tabulated binary listing where each primary term is available for inspection without having been encoded it would still be necessary to scan each entire column until at least one transition was found in order to verify the presence of activity on each signal. And even then, such a visual check is based solely upon the displayed information, not upon all the information the analyzer has been monitoring, regardless of whether those states were captured or displayed or not. It would therefore be advantageous if the logic state analyzer itself provided an indication of a minimum level of activity for each input signal.

According to a preferred embodiment of the invention described below each input signal is periodically sampled and the sample compared with previous samples to determine which signals have changed in value and which have not. Any failure of a signal to change will cause an annunciator associated with each input signal to display a symbol (or perhaps the absence of a signal) indicative of "no activity". To provide compatibility with refreshed CRT displays where the rate at which a displayed symbol can change is limited by the refresh rate anyway, and to present a more readily perceived change in the values of the annunciators, some convenient number of the periodic samples are "bundled together" into consecutive samples treated as follows. Assume a convenient number is one hundred. Then a signal must change state within each of the one hundred consecutive periodic samples or the entire bundle is "ruined" and the associated annunciator displays "no activity" for a discernible length of time (i.e., at least for as long as it takes to obtain the next "bundle").

DESCRIPTION OF THE FIGURES

FIG. 1 illustrates the interactive format specification display.

FIG. 2 illustrates the interactive trace specification display.

FIG. 3 illustrates a trace list display of the stored data states.

FORMAT SPECIFICATION

Data formatting permits the partitioning of 32 input data channels into parameters of interest. Contigious data channels which behave as a single parameter may be assigned to one of six labels (A-F). For example, in FIG. 1, illustrating the interactive format specification display, 16 bits of an address bus have been assigned to label "A", 8 bits of a data bus have been assigned to label "D", 1 bit of data on pod 1 has been assigned to label "F", and 7 bits have been left unassigned (labeled "X"). Further specifications and data manipulations are made by referencing these labels. Each assigned label may be independently declared to have a positive or negative "logic polarity" and converted to an independently selected radix which can be binary, octal, decimal or hexedecimal. Further, the slope of the positive or negative clock transition at which time the input data channels are sampled can be selected ("clock slope").

Figure 15:
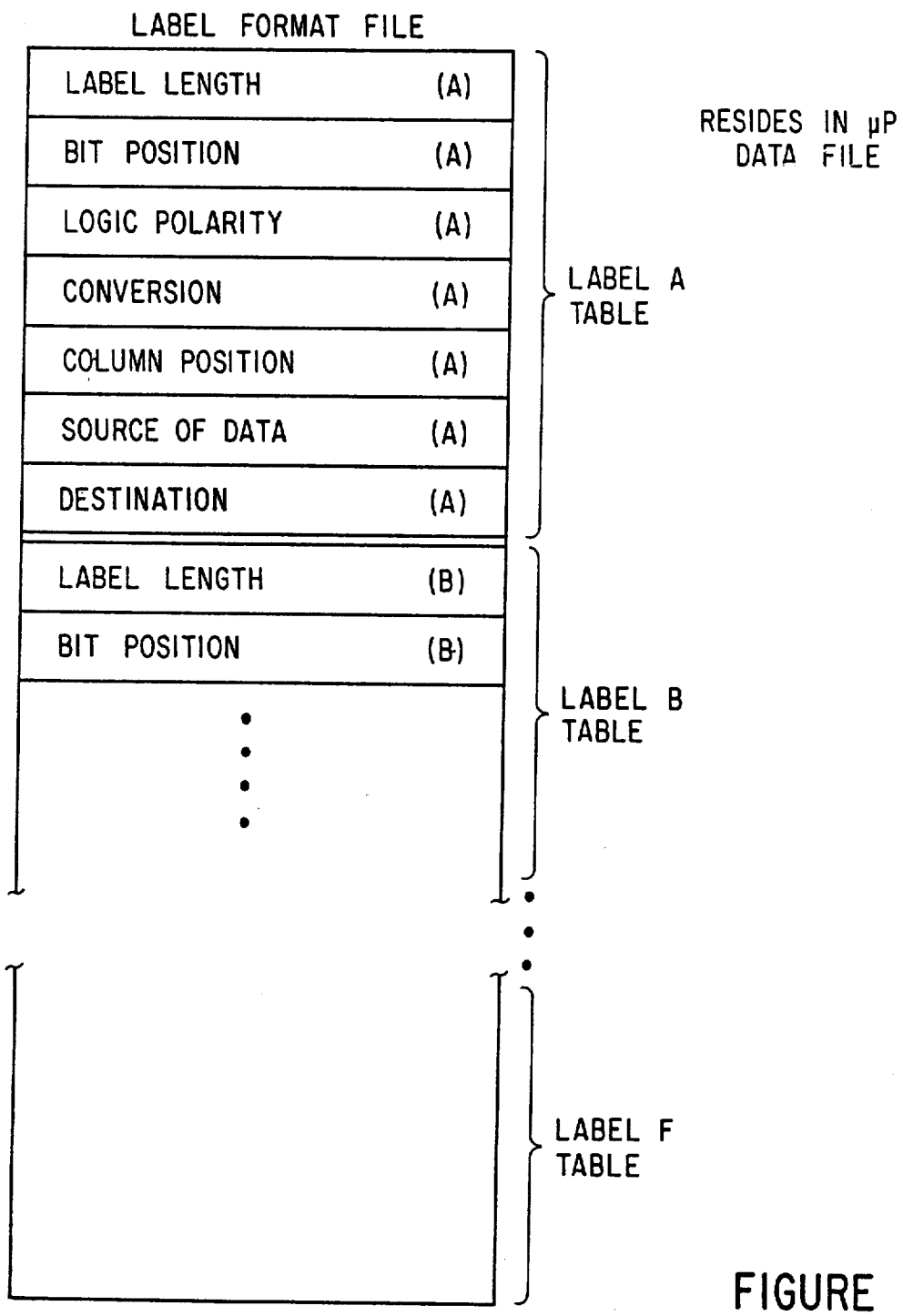
FIG. 15 illustrates the format of the label format file.
Figure 16:
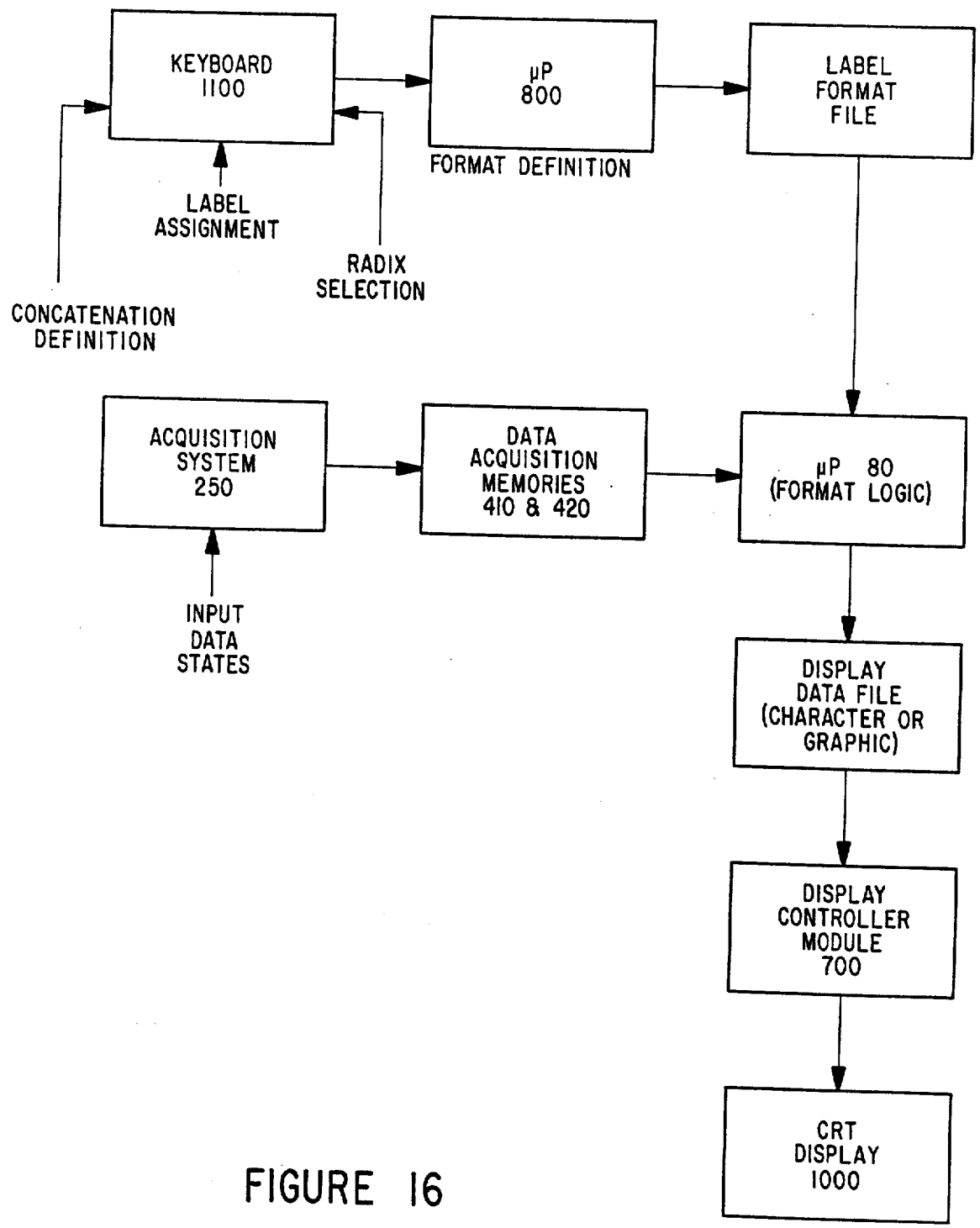
FIG. 16 illustrates the logic flow of the display formatting logic.

Keyboard entries to the microprocessor 800, as shown in FIG. 16, permit the construction of the label format file, shown in more detail in FIG. 15 which, contains the format specification parameters. This is used to process the stored data states in the construction of the alphabetically cancatenated ASCII display data file and the graphic display data file. Either of the display data files is subsequently selected and used for display purposes by the display control module 700 and the CRT display 1000.

TRACE SPECIFICATION

The assigned input data channels are sampled at the specified clock transitions and are treated as one sampled state. The trace specification defines which of the sampled states are to be stored for display and which sampled states are to be counted for count measurements. The trace specification comprises a definition of state conditions specifying the trace position, the selective trace, and the count measurement. Each state condition defines a state of the assigned input data channels in any combination of 1's, 0's, and/or X's (don't care). In octal, decimal or hexedecimal bases the definition is defined in terms of the appropriate alphamumerics and X's.

A trace position may be selected to a start, center or end the selective trace in response to the input data satisfying a predefined state sequence. In this description it will be assumed that the trace position starts the selective trace. A state sequence of up to seven state conditions must be satisfied in a specified order, ignoring intermediate states which do not satisfy the state sequence. The simplest state sequence is a single state condition. Specific segments of branched, looped or nested forms of state flow may be directly located by properly defined state sequences. In addition, each state condition in a state sequence may be specified to occur from 1 to 65536 times before the state condition is satisfied. This form of positioning will locate the nth pass of a loop beginning at a give state condition. Clock delay may be incorporated by defining the nth occurrence of any state (an all don't care state specification). The trace logic may also be specified to restart the satisfaction of the predefined state sequence if it is not satisfied before or concurrently with the location of a predefined restart state condition. A restart on "any state" requires that the state sequence be satisfied without any unspecified intermediate states. For example, FIG. 2 illustrates the interactive trace specification display for a trace position starting upon the satisfaction of 4 state conditions in sequence. A restart state condition is also defined.

The selective trace is a qualification of which sampled states will be stored for display. One to seven state conditions may be "OR" specified for collection. Selectively tracing only sampled states of interest eliminates the clutter of unneccessary states and magnifies the apparent size of the trace beyond its 64 terms. Also, an occurrence term may be specified so as to store only every nth satisfaction of an "OR" specified state condition. FIG. 2 illustrates the selective trace of every occurrence of a single state condition.

The count measurement performs a "time" or a "state" count associated with each of the (64) states stored and can be displayed in one of two formats:

absolute—the count from the trace position relative—the count from the previous trace state The time count is performed by counting the occurrences of an internal clock between sequentially stored states and the display is in the units of seconds. A state count similarly counts the number of occurrences of a specified state condition ("count") between sequentially stored states. For example, specifying "any state" would result in a count of the selected clock transitions of the input data. In FIG. 2, a state count is performed on the occurrences of a specified state condition intermediate to each sampled state stored.

INTERNAL MEASUREMENT STORAGE

One complete measurement of 64 sampled states, which includes the sampled states satisfying the state conditions defining the state sequence and specifications of the format, trace, and display, may be internally stored. The "current measurement" may be stored or exchanged with a "stored measurement" for later analysis. A "trace compare" (described more fully below) compares results of a previously stored trace with the current measurement and may be utilized as a further qualifier on data storage.

DISPLAY SPECIFICATION

The output display format of the current measurement may be selected from a trace list, a trace graph, or a trace compare.

A trace list, illustrated in FIG. 3, displays a listing of the stored states in their order of occurrence. Twenty trace states, (one per line) are simultaneously presented on the CRT display. The "ROLL" keys allow scanning of the 64 stored states. Each line comprises a line number, the stored state alphabetically sorted into assigned labels in their numerical base, and the time or state count if selected.

Figures 4, 5:
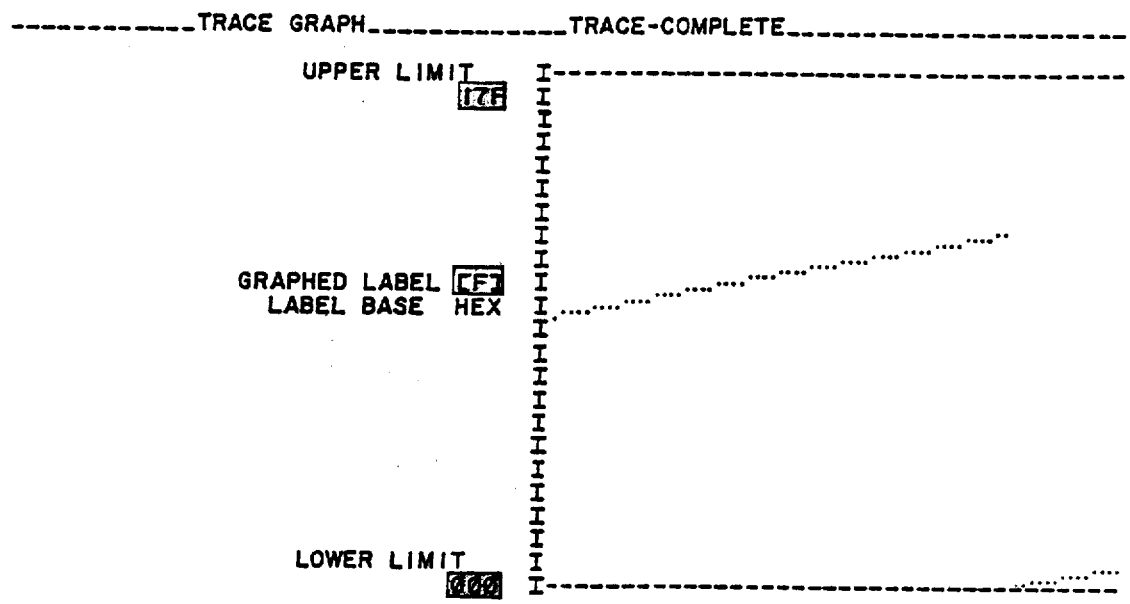
FIG. 4 illustrates a trace graph display of the stored data states.
FIG. 5 illustrates a trace compare output display list.

A trace graph, as shown in FIG. 4, presents a graph of the data magnitude of a specified label versus the storage location for all 64 stored states. Each state is given a vertical displacement corresponding to its binary magnitude and an increasing horizontal displacement for successive states in order of their occurrence. The result is a waveform analogous to oscilloscope displays of voltage magnitude. The label to be graphed is selected by specifying the "graphed label". Scaling of state magnitude is controlled by specifying the "upper limit" and "lower limit" on the vertical axis. Limits can be specified directly or dynamically varied with logrithmic autoranging controls. These facilities allow any portion of a graph to be magnified to a full scale presentation. The 20 points corresponding to the lines viewed in the trace list are intensified. The intensified portion also responds to the "ROLL" controls, and their corresponding absolute value may be read in the trace list.

A trace compare as illustrated in FIG. 5 presents a tabular listing of the difference between results in the "current measurement" and the data in the "stored measurement". The listing is formatted and rolled as in the trace list. The results of the two measurements are exclusive "ORED" such that identical corresponding bits are displayed as zeros and unequal bits are displayed as ones. In an octal base a "φ3" is equivalent to a binary "φφφ φ11" and indicates that the right two bits are different in the two measurements. Trace compare also offers a "compared trace" mode which reruns a measurement until the current and stored measurement are either equal or not equal. (STOP=, or STOP≠) For example, in FIG. 5 of the instrument has rerun trace measurements until the "current measurement" equaled the "stored measurement", as indicated by the "STOP=" specification and revealed by the array of "0"'s in the comparison.

TRACE MODES

Three trace mode options are provided. "Trace" executes a single current measurement. "Continuous trace" repeats the execution of a current measurement continuously. "Compared trace" repeats the execution of a current measurement until the desired comparison with the stored measurement is obtained.

CLOCK ENABLE AND TRIGGER OUTPUTS

A trigger output provides a triggering pulse for external instrumentation such as oscilloscopes. A 50 ns pulse is generated each time the trace position is found. The clock enable output is useful for gating clocks or interrupting the device under test. A high signal level indicates that the instrument is actively searching for the trace position. It remains at the high signal level until the trace position has been found or the halt key is depressed. Both outputs are suspended when the format specification is displayed to allow measurement of channel activity.

KEYBOARD AND SPECIFICATION DESIGNATION

Figure 6:
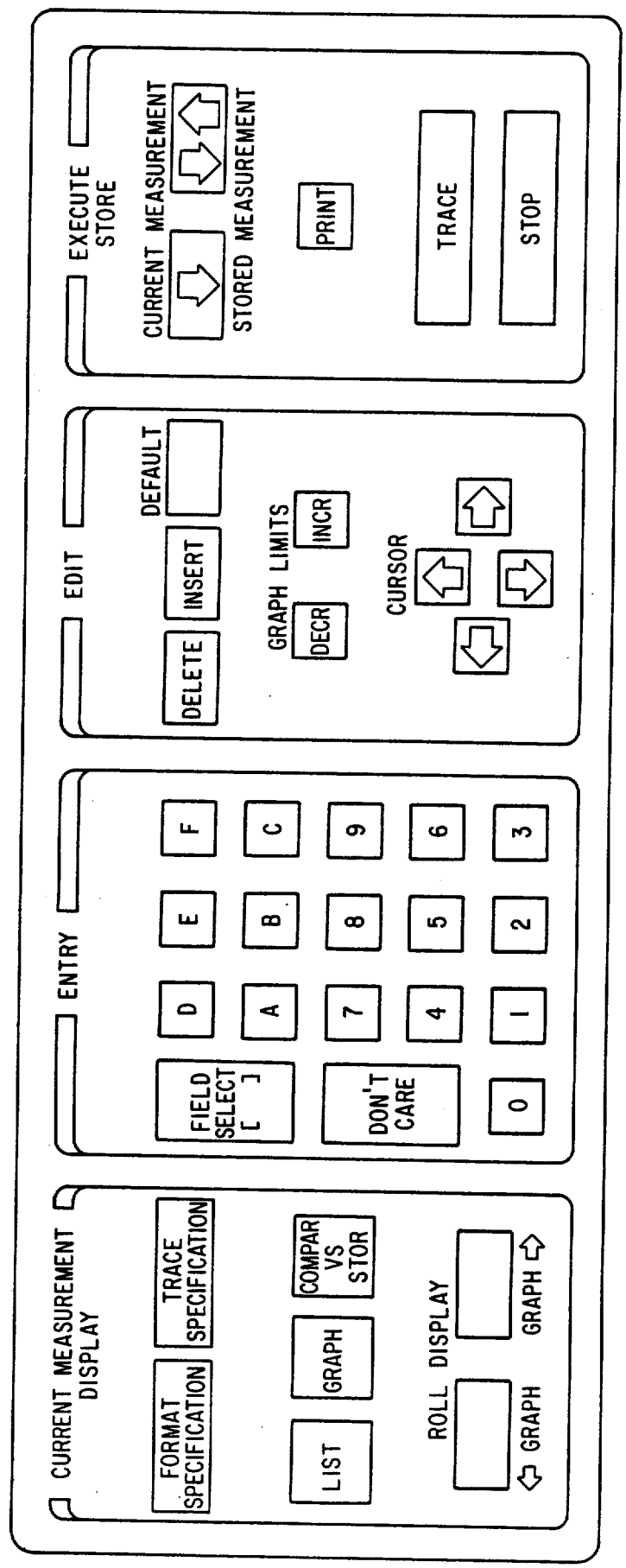
FIG. 6 illustrates the input keyboard.

Referring to FIG. 6, an illustration of the keyboard, the keys are functionally segregated into four blocks, the "current measurement display", "entry", "edit", and "execute". A power up sequence initially defines a default set of specifications, displays the default format specification, then automatically selects a hexadecimal trace list display. Activation of the "ROLL DISPLAY" keys permits the presentation of any portion of the 64 states stored. To change the format specification, the "FORMAT SPECIFICATION" key is pressed. The cursor keys in the edit block are used to move the cursor, designating a selectable entry field by a blinking inverse video field on the interactive display.

The trace specification can be edited by selecting the trace specification interactive display by activating the "trace specification" key. Editing is accomplished in the same manner as the format specification is edited. A general description of the functions of the individual keys is given in Appendix A. A detailed description of the interactive display entry fields is given in Appendix B.

DETAILED DESCRIPTION

Figure 7:
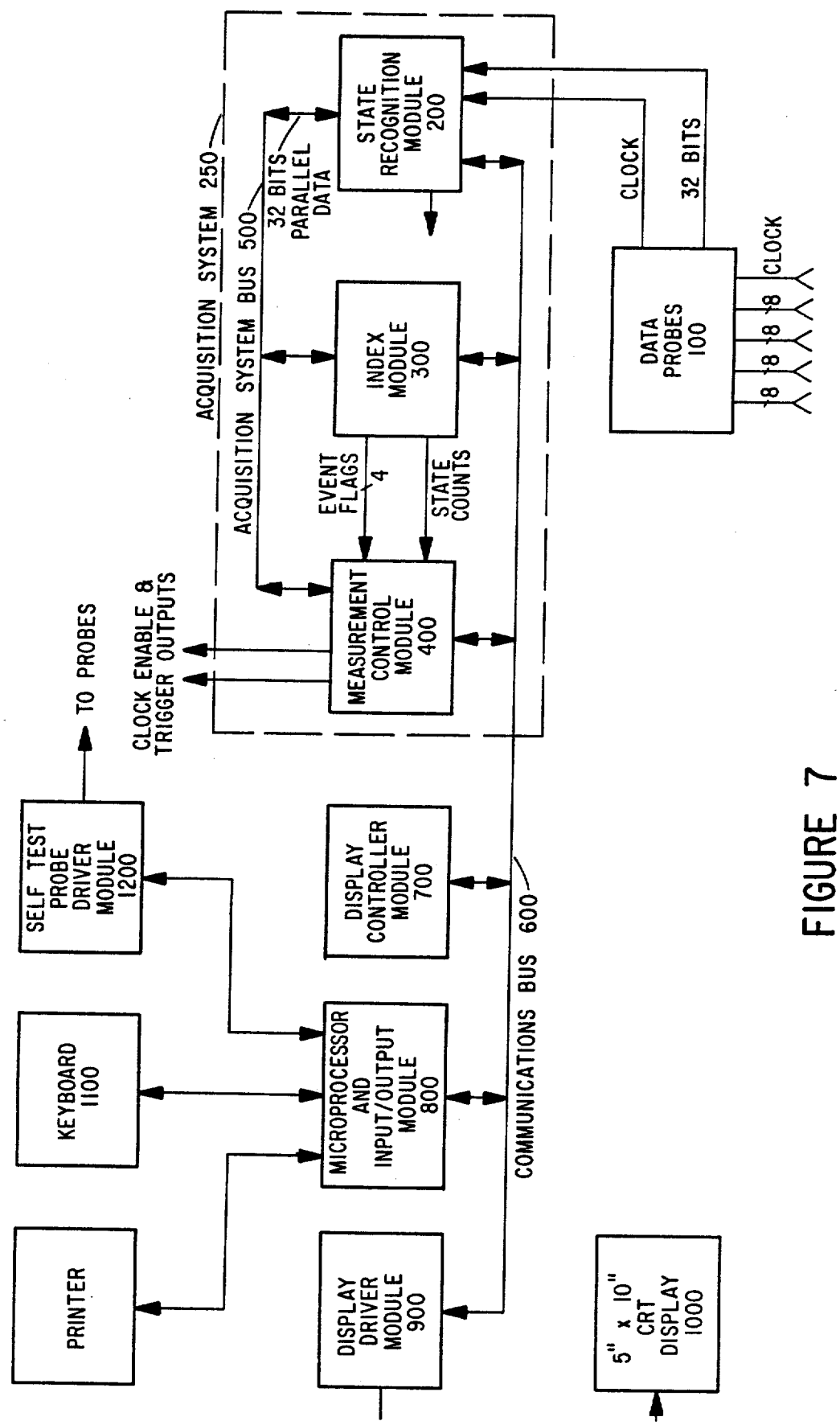
FIG. 7 illustrates a block diagram of the present invention.

Input states are sensed through 32 high impedance variable threshold data probes at rates up to 10 MHz. The data probes 100, illustrated in FIG. 7, are segmented into four 8 bit data pods and a fifth pod for clock sensing. Each pod may be preset to TTL logic threshold or variably adjusted in the range of +10 to −10 volts to interpret input logic levels.

The 32 input data channels and the clock signal from the data probes 100 are input to the state recognition module 200. An internal sampling clock is generated in response to the selected clock slope, the input data signals are compared to the selected threshold voltages and interpreted, and the data signals are latched in response to occurrences of the internal sampling clock. The state recognition module 200 outputs the sampled state to the high speed acquisition system bus 500. The index module 300 accesses the sampled state on the acquisition system bus 500, compares the sampled state to the selected state conditions and determines the trace position, selective storage events and state count events. The measurement control module 400 also accesses the acquisition system bus 500 and stores state or time counts and sampled data states in response to the events detected by the index module 300.

Figure 8:
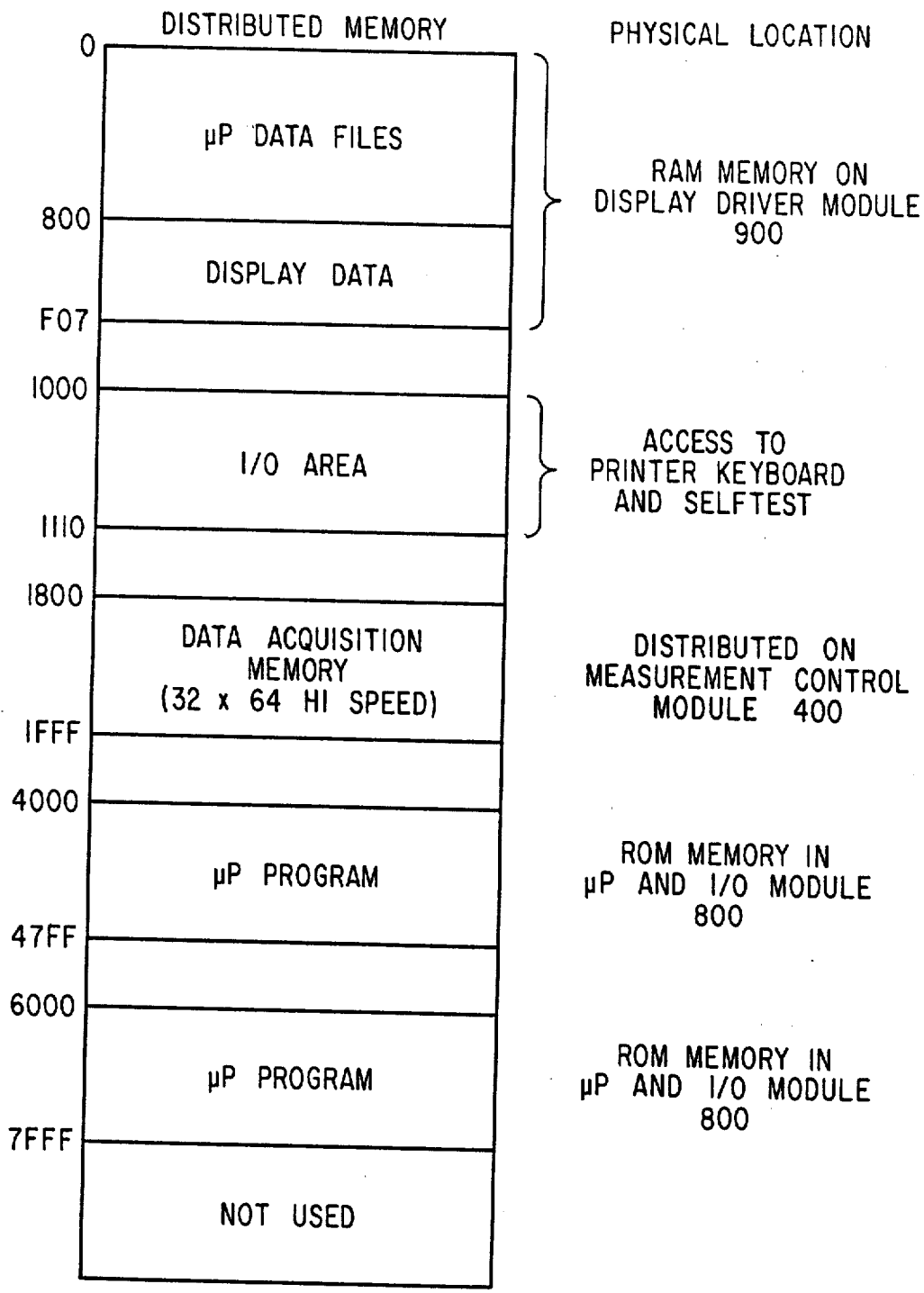
FIG. 8 illustrates the distributed memory addressing of the present invention.
Figure 9:
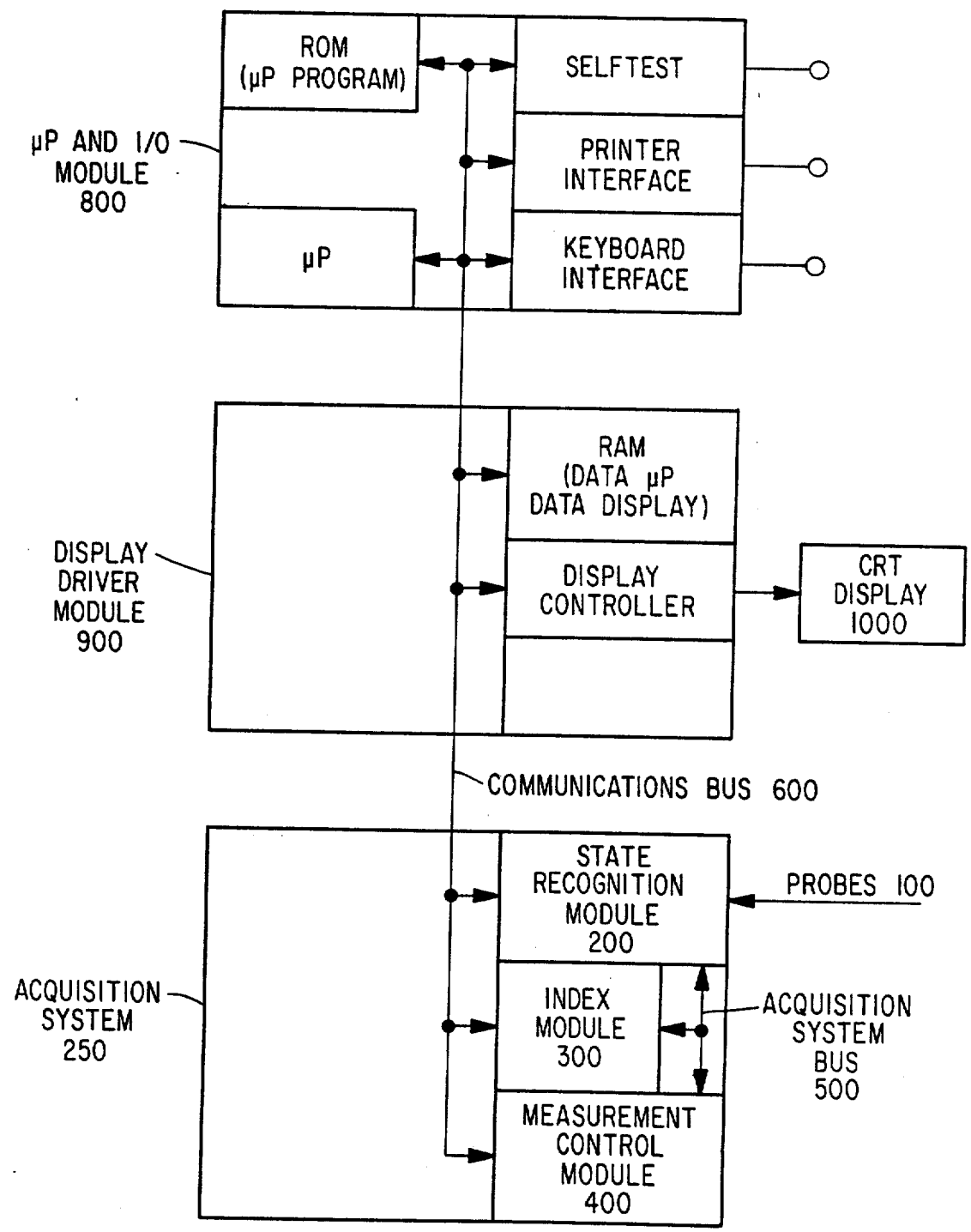
FIG. 9 illustrates the relationship between physical and logical addresses of the distributed memory of FIG. 8.

The modules of the acquisition system 250 communicate with other system modules via the communications bus 600, which prevides a means for addressing selected modules and for transferring selected data. The entire system functions as a distributed memory, as illustrated in FIG. 8. For instance, addresses between 1800 and 1FFF on the communications bus 600 access the state count measurements and the sampled data states stored in the measurement control module 400 memories. FIG. 9 shows another representation of the system architecture, illustrating the relationship between the physical couplings of FIG. 7 and the logical addresses of FIG. 8.

Figure 10:
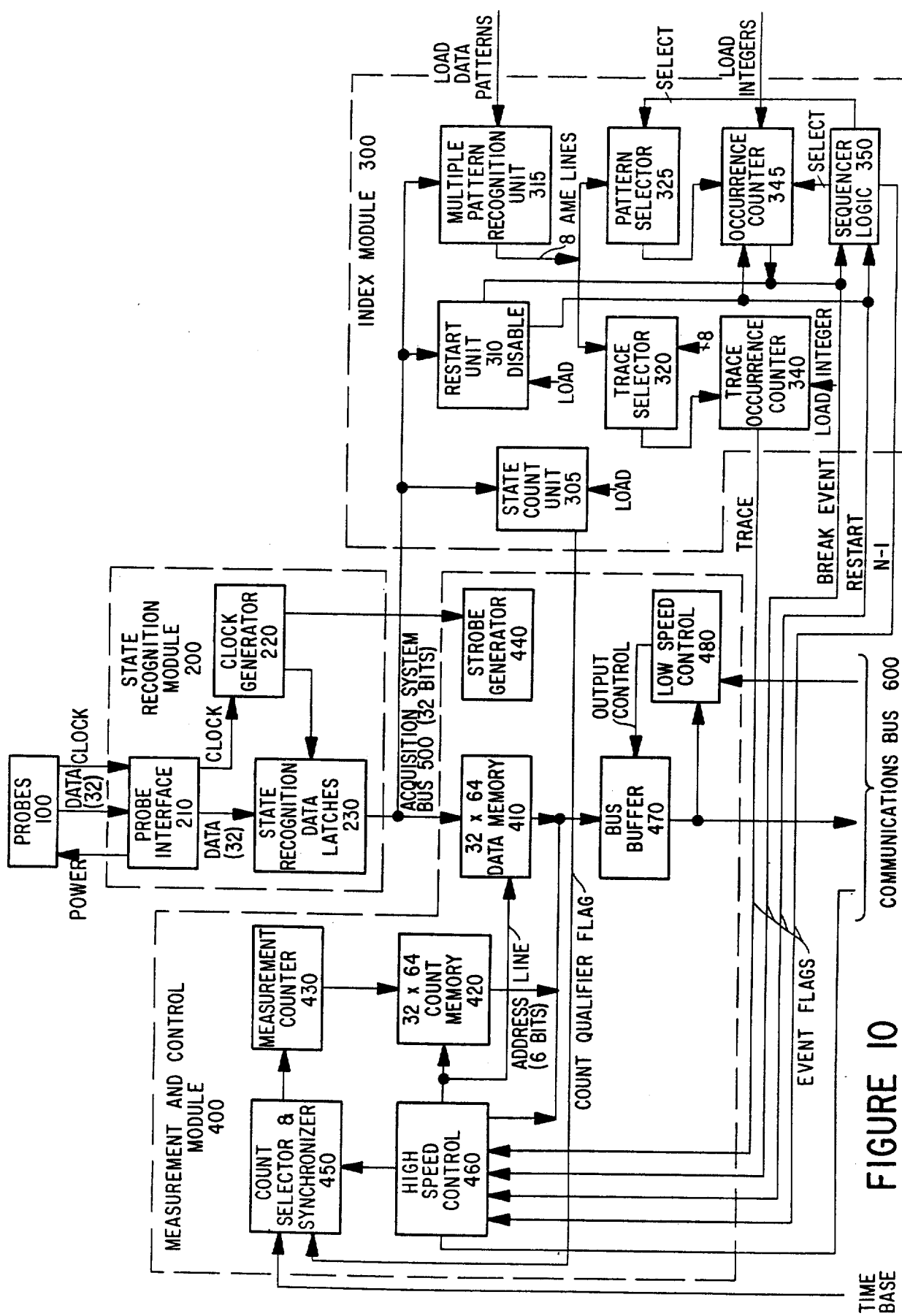
FIG. 10 is a block diagram of the acquisition system.
Figure 11:
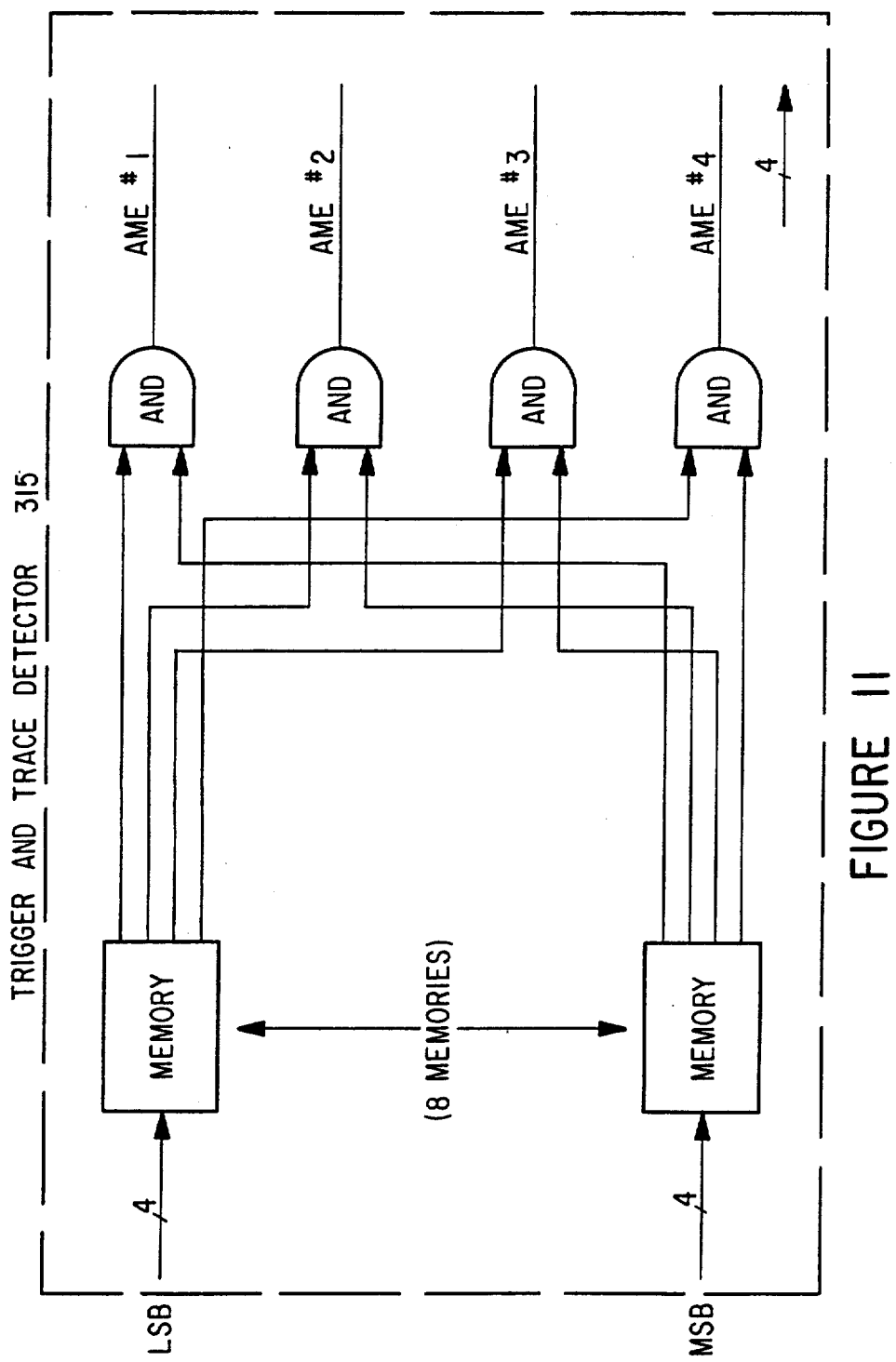
FIG. 11 illustrates a multiple pattern recognition unit.
Figure 12:
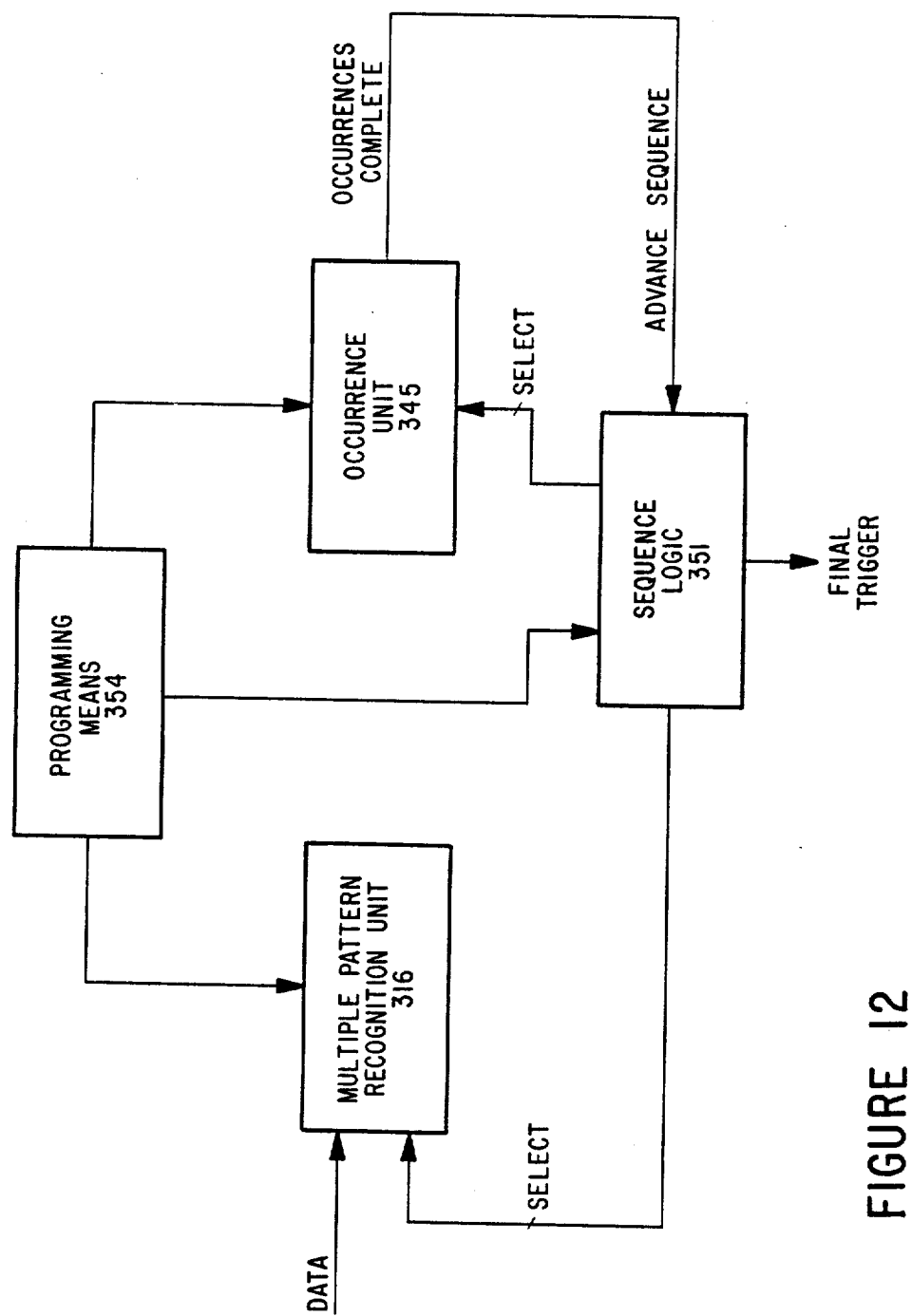
FIG. 12 illustrates a simplified sequential triggering circuit.

Referring to FIG. 10, the index module 300 detects the trace position by first comparing the sampled state on the acquisition system bus 500 with a qualifier state condition stored in the multiple pattern recognition unit 315. The multiple pattern recognition unit 315 comprises a digital pattern triggering circuit as described the copending patent application entitled "DIGITAL PATTERN TRIGGERING CIRCUIT", U.S. patent application No. 743,188 filed Nov. 19, 1976, WILLIAM A. FARNBACH. As illustrated in FIG. 11, the multiple pattern recognition unit 315 comprises 2 pairs of 8 sixteen by four bit memories providing for the detection of up to eight qualifier state conditions, where each qualifier state condition is identified by a 1, 0, X input, format (in binary). Pattern selector 325 of FIG. 10 selects one of the eight lines output from the multiple pattern recognition unit and passes the selected output to the occurrence counter 345. The occurrence counter 345 counts the occurrences of the selected qualifier state conditions and provides an output in response to counting a specified number of occurrences of the selected qualifier state condition. This output is termed a "break event" and the sequencer logic 350 in response requests the pattern selector 325 to select the next sequential qualifier state condition and requests the occurrence counter 345 to select the corresponding count. The sequencer logic 350 also outputs a "N-1" event flag in response to detection of the occurrence of the "NEXT TO LAST BREAK EVENT". A simplified sequential triggering circuit is illustrated in FIG. 12 where the multiple pattern recognition unit 316 incorporates the functions of the multiple pattern recognition unit 315 and of the pattern selector 325. The sequence logic 351 incorporates the functions of the sequence logic 350 except that the final trigger is output in response to the completion of the state sequence. Another method of implementing the multiple pattern recognition unit 316 would be to have 3 selector bits be the most significant bits in the address, allowing the comparator to sequence through various segments of memory when comparing sequential state conditions of the state sequence.

Referring again to FIG. 10, the selective trace is incorporated in a similar manner except that the trace selector 320 of FIG. 10 can "OR" any combination of the AME lines. A trace occurrence counter 340 outputs a trace event flag upon counting each "nth" "ORED" AME event.

The restart unit 310 causes the sequence logic 350 to restart the satisfaction of the state sequence subsequent to the detection of a selected restart state condition. The restart unit is disabled for the data state corresponding to the detection of a break event by sequencer logic 350 which permits the state sequence to be satisfied without any unspecified intermediate state by setting the restart state condition to "any state".

The state count unit 305 strobes a counter in the measurement control module 400 each time the selected state condition to be counted is detected.

Figure 13:
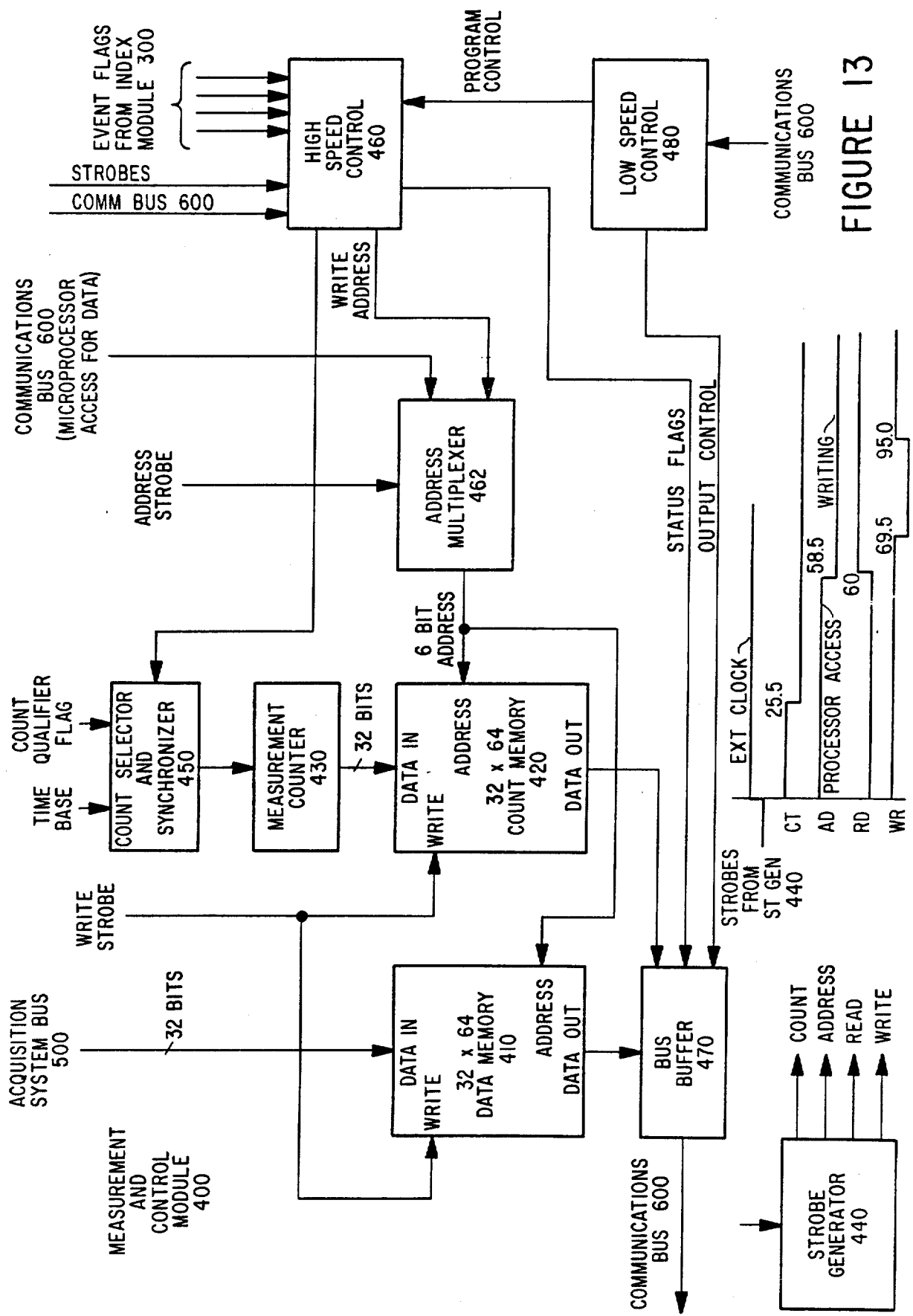
FIG. 13 illustrates the measurement and control module.
Figure 14:
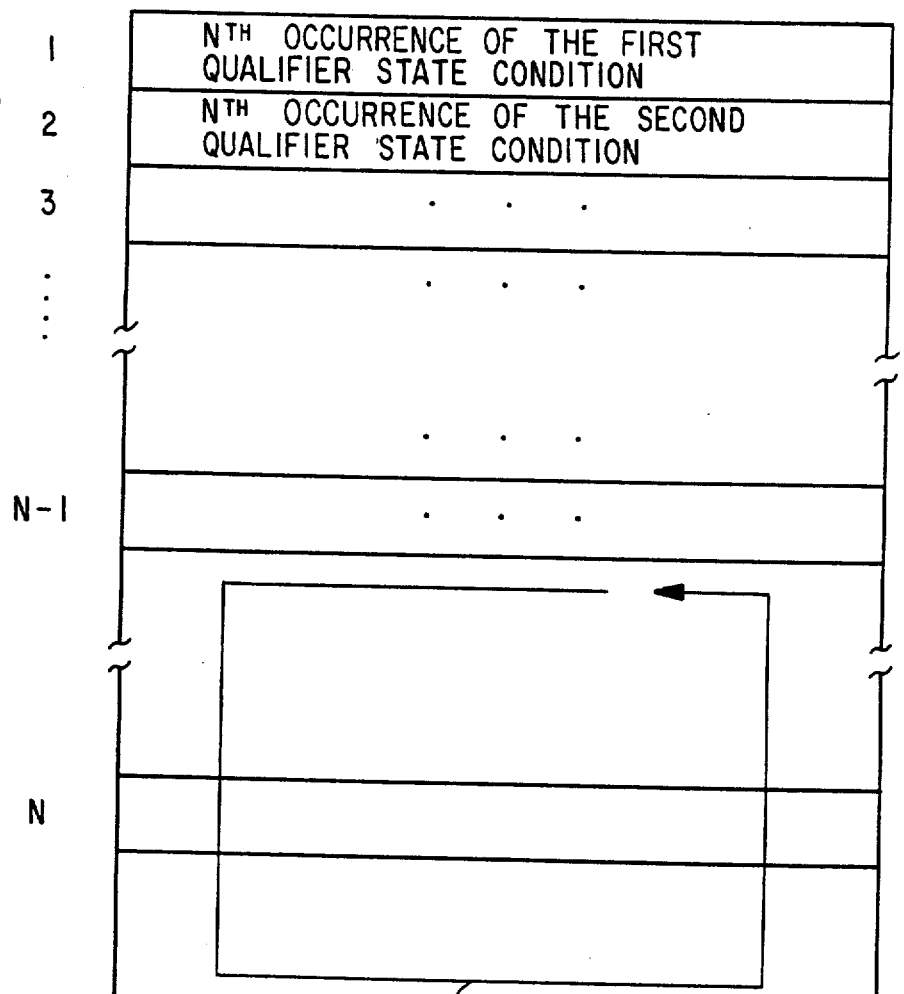
FIG. 14 illustrates the data format of the data memory.

The measurement and control module 400 is illustrated in FIGS. 10 and 13. The event flags from index module 300 are input to the high speed control 460 and determine which sampled states on the acquisition system bus 500 are to be stored. The high speed control 460 addresses the data memory 410 and the count memory 420 accordingly. FIG. 14 illustrates the data format of the data memory 410. The sampled state conditions resulting in break events are sequentially stored in locations 1- (N-1). Upon detection of the "N-1" event flag, sampled state conditions are sequentially written into the remaining memory locations, writing over the oldest data when the memory is filled. The trace position address of the memory location containing the state condition resulting in the final trigger is stored in a register and sampled states are written into the appropriate number of remaining storage locations. For example, if the trace was defined to end on the detection of the trace portion, no sampled states would be written subsequent to the detection of the trace position. The order of occurrence of the stored data is easily reconstructed by recovery of the trace position address appearing on the communications bus 600 as illustrated in FIG. 8. Count selector and synchronizer 450 controls the measurement counter 430, whose contents are stored in count memory 420 upon update of the memory address. The low speed control 480 provides a low speed interface for programming the high speed control 460 and for selecting and latching data for the communications bus 600 interface.

The strobe generator 400, illustrated in FIGS. 10 and 13, generates a sequence of strobes which, when coupled with a series of data latches (not shown) and timing logic (not shown) effectuate the orderly performance of machine tasks. In effect, a number of sampled states are simultaneously in various stages of processing at any one time and are "pipelined" through the required logic blocks.

ACTIVE CHANNEL DETERMINATION

Referring to FIG. 1, the symbol "!" appears below certain assigned input data channels in the format specification. Approximately once every millisecond the sampled state is compared to a "last sample" buffer. The states are exclusively "ORED" to detect any bit changes. The result is then "ANDED" with an activity buffer and the sampled state input to the "last sample" buffer. After 100 samples the activity buffer is sampled for display purposes. Only the assigned channels are displayed. Absence of a "!" indicates low channel activity and is a good indicator that a pod clip may have fallen off during the measurement or the channel is otherwise suspect.

---

APPENDIX A

GENERAL DESCRIPTION-KEYBOARD

CURRENT MEASUREMENT DISPLAY

| | | |
|---|---|---|
| LINES 3 THROUGH 24 ARE DEPENDENT ON DISPLAYED MENU CHOSEN, WHICH MAYBE SELECTED BY KEYS IN CURRENT MEASUREMENT BLOCK: | | |
| | FORMAT SPECIFICATION | SELECT CLOCK SLOPE AND FORMAT 32 CHANNELS INTO LOGICAL LABELS AND DESIRED LOGIC POLARITY AND NUMERICAL BASE. |
| | TRACE SPECIFICATION | DEFINE TRACE POSITION, SELECTIVE TRACE AND COUNT MEASUREMENT. |
| | LIST | DISPLAY RESULTANT CURRENT TRACE AND COUNT DATA. |
| | GRAPH | GRAPH RESULTANT CURRENT TRACE DATA FOR SELECTED LABEL. THE 20 INTENSIFIED DOTS CORRESPOND TO TRACE LIST DATA. |
| | COMPARE VS STORE | DISPLAY "EXCLUSIVE OR" OF VALID CURRENT DATA WITH VALID STORED DATA, AND SELECT COMPARED TRACE MODE. |
| | ROLL DISPLAY | VIEW TRACE LIST OR TRACE COMPARE DATA. TRACE GRAPH SHOWS INTENSIFIED DOTS THAT |
| | GRAPH GRAPH | REPRESENT THE TRACE LIST DATA DISPLAYED. |

ENTRY

ALL PROGRAM ENTRIES ARE MADE IN INVERSE VIDEO FIELDS AT THE BLINKING CURSOR, AND MAYBE CHANGED BY ENTRY BLOCK OF KEYS:

| | |
|---|---|
| FIELD SELECT [ ] | ALL FIELDS ENCLOSED WITH BRACKETS [ ] ARE CHANGED BY THIS KEY. THE 1610A SELECTS ONLY ALLOWED CHOICES. |
| 0-9, A-F, X | ALL OTHER FIELDS MAYBE CHANGED USING THESE KEYS. |

EDIT

DISPLAYED MENUS MAYBE EDITED BY EDIT BLOCK OF KEYS:

| | |
|---|---|
| DELETE  INSERT | USED IN TRACE SPECIFICATION MENU ONLY TO OPTIONALLY DELETE OR INSERT STATES TO SPECIFY TRACE POSITION AND SELECTIVE TRACE. A MAXIMUM OF 6 STATES MAYBE USED BETWEEN TRACE POSITION AND SELECTIVE TRACE. |
| DEFAULT | RETURN DISPLAYED MENU TO KNOWN (PRESET, TRACEABLE) CONDITION. |
| INCR  DECR | USED IN TRACE GRAPH ONLY TO AUTOMATICALLY CHANGE UPPER OR LOWER GRAPH LIMITS. |
| | TO MOVE BLINKING CURSOR TO DESIRED FIELD. |

EXECUTE

THE REMAINING KEYS ARE THE EXECUTE BLOCK OF KEYS:

| | |
|---|---|
| CURRENT MEASUREMENT | KEY SAVES CURRENT SPECIFICATION AND DATA MEASUREMENT IN A STORED FILE. THE CURRENT SPECIFICATION AND DATA REMAINS UNCHANGED. |
| STORED MEASUREMENT | KEY EXCHANGES CURRENT AND STORED MEASUREMENT FILES. |
| PRINT | PRINT CURRENT DISPLAY, EXCEPT TRACE GRAPH ON AN HP 9866 LINE PRINTER USING CONNECTOR ON REAR OF 1610A. TRACE LIST AND TRACE COMPARE WILL PRINT CURRENT PAGE AND ANY REMAINING DATA IN MEMORY. |
| TRACE | EXECUTES CURRENT SPECIFICATION, AND IF DISPLAY IS FORMAT SPECIFICATION OR TRACE SPECIFICATION, THE 1610A SWITCHES DISPLAY TO TRACE LIST. IF TRACE IS HELD DOWN, THE MEASUREMENT IS TRACED CONTINUOUSLY. IF COMPARE TRACE MODE IS SET FOR [STOP=] OR [STOP≠] THE MEASUREMENT IS TRACED UNTIL COMPARED CONDITION IS MET. THE INSTRUMENT STATUS (1ST LINE) IS "COMPARED TRACE-FAILED", IMPLIES CONDITION NOT MET, OR "COMPARED TRACE-COMPLETE", IMPLIES CONDITION MET. |
| STOP | STOPS ANY MEASUREMENT TRACE, COMPARED TRACE OR PRINT IN PROCESS. |

APPENDIX B

DETAILED FIELD/S DESCRIPTION

CLOCK SLOPE:

EXAMPLES: CLOCK SLOPE (+)
CLOCK SLOPE (-)

PURPOSE: TO SELECT CLOCK TRANSITION TO STROBE POD DATA INTO 1610A.

LABEL ASSIGNMENT AND ACTIVE CHANNELS:

EXAMPLES:

```
      POD4      POD3      POD2      POD1
      7------0  7------0  7------0  7------0
      AAAAAAAA  AAAAAAAA  DDDDDDDD  XXXXXXXF
      11111111  11111111  11111111         1
                        ACTIVE CHANNELS
```

PURPOSE: TO ASSIGN LABELS A,B,C,D,E OR F TO ANY NUMBER OF CONTINUOUS CHANNELS INDEPENDENT OF POD BOUNDARIES. IN THE ABOVE EXAMPLE THE LABEL A
IS ASSIGNED TO 16 BITS OF POD3 AND POD4, AND MAY REPRESENT A 16 BIT ADDRESS. LABEL D IS ASSIGNED 8 BITS ON POD2 AND MAY REPRESENT AND 8 BIT DATA BUS. LABEL F IS ASSIGNED TO BE A SINGLE BIT QUALIFIER (READ, WRITE) AND IS ASSIGNED TO LEAST SIGNIFICANT BIT ON POD1.
ANY UNUSED CHANNELS MAYBE TURNED OFF BY PUTTING A "X" IN GIVEN CHANNELS.

COMMENT: AS MANY AS SIX LABELS OR AS FEW AS ONE MAYBE ASSIGNED ACROSS THE 32 CHANNELS. IF A LABEL IS SPLIT, SUCH AS

AABBBAAA        (LABEL IS NOT CONTINUOUS)

THEN AN ERROR MESSAGE "ERROR-SPLIT LABEL" IS DISPLAYED AND THE CURSOR IS LOCKED TO LABEL ASSIGNMENT FIELDS UNTIL THE ERROR IS CORRECTED.
PRESSING DEFAULT KEY WILL ASSIGN LABEL F TO ALL 32 CHANNELS.
ACTIVE CHANNELS ARE SHOWN BY "1" MARKS FOR EACH ASSIGNED CHANNEL. ABSENCE OF "1" INDICATE LOW CHANNEL(BIT) ACTIVITY, AND ARE GOOD INDICATORS OF POD CLIPS THAT MAY HAVE FALLEN OFF. CHANNEL ACTIVITY IS NOT DISPLAYED WHILE 1610A IS TRACEING.

IF POD IS CONNECTED TO DATA PORT ON REAR OF 1610A, THE CHANNEL ACTIVITY "1" FOR LEAST SIGNIFICANT 2 BITS IS NOT SHOWN( DUE TO SYNCHRONOUS 6 BIT COUNT AND 1610A).

LOGIC POLARITY:

EXAMPLES: LABEL      A    D    F
LOGIC POLARITY  (-)  (-)  (+)
(+,-)

PURPOSE: TO SELECT A LOGIC POLARITY FOR EACH ASSIGNED LABEL.

NUMERICAL BASE:

EXAMPLES: LABEL            A      B      F
NUMERICAL BASE         (HEX)  (OCT)  (BIN)
(BIN,OCT DEC,HEX)

PURPOSE: TO SELECT A NUMERICAL BASE TO BE HEXIDECIMAL(HEX),
OCTAL(OCT),DECIMAL(DEC),OR BINARY(BIN) FOR
EACH ASSIGNED LABEL.

TRACE POSITION:

EXAMPLE:   [START ] TRACE
           [CENTER] TRACE
           [ END ] TRACE

PURPOSE: TO SELECT TRACE POSITION TO BE SOME GIVEN STATE
AND ITS POSITION IN RESULTANT DATA TRACE FILE
SHOULD BE AT [START] FOLLOWED BY SELECTIVE TRACE
STATES,OR AT [CENTER] SHOWING ANY SELECTIVE STATES
BEFORE AND AFTER "CENTER STATE",OR AT [END]
SHOWING ANY SELECTIVE STATES BEFORE THE "END STATE".

EXAMPLE:       LABEL          A          OCCUR
               BASE           HEX        DEC

FIND IN SEQUENCE       1Ø         ØØØØ1
            THEN              2Ø         ØØØØ1
            THEN              3Ø         ØØØØ5
       [START ] TRACE         4Ø         ØØØØ1

SEQ.RESTART [ON]       5Ø

COMMENT: THIS EXAMPLE HAS THE FOLLOWING MEANING FOR DEFINING
TRACE POSITION:
FIND IN SEQUENCE ØØØØ1 OCCURANCE OF STATE 1Ø,THEN
THE ØØØØ1 OCCURANCE OF STATE 2Ø, THEN THE ØØØØ5 OCCURANCE
OF STATE 3Ø,AND [START] TRACE AT ØØØØ1 OCCURANCE
OF STATE 4Ø.
IF DURING THIS SEQUENCE THE RESTART STATE 5Ø IS
ENCOUNTERED BEFORE REACHING THE ØØØØ1 OCCURANCE OF
STATE 4Ø,THE MEASUREMENT RESTARTS,TO FIND IN SEQUENCE
THE ØØØØ1 OCCURANCE OF STATE 1Ø,THEN ØØØØ1 OCCURANCE
OF STATE 2Ø ETC.
NOTE: IF A SEQUENCE STATE IS DEFINED TO BE THE SAME AS THE
RESTART STATE,THE SEQUENCE STATE DOMINATES.
IF [CENTER] OR [END] WERE SELECTED,SELECTIVE
TRACE STARTS AT COMPLETION OF 5 OCCURANCES
OF STATE 3Ø (SEE SELECTIVE TRACE).

SELECTIVE TRACE:

EXAMPLE:   LABEL          A          OCCUR
           [ALL STATES]

PURPOSE: TO TRACE ALL STATES.

EXAMPLE:       LABEL          A          OCCUR
               BASE           HEX        DEC
       TRACE
         [ONLY STATE]         6Ø         ØØØØ1
              OR              7X
              OR              8X

PURPOSE: TO SELECTIVELY TRACE DESIRED STATES.

COMMENTS: THE ABOVE EXAMPLE HAS FOLLOWING MEANING:
DO A SIMULTANEOUS TRACE OF ØØØØ1 OCCURANCE
OF STATES 6Ø OR 7X (7Ø TO 7F) OR
8X (8Ø TO 8F).

UPPER/LOWER LIMITS:

EXAMPLE:
    UPPER LIMIT
       177

LOWER LIMIT
       000

PURPOSE: TO CHANGE UPPER OR LOWER GRAPH LIMITS.

COMMENT: GRAPH LIMITS MAYBE CHANGED USING ENTRY KEYS OR
THE LIMITS MAYBE AUTOMATICALLY INCREMENTED OR
DECREMENTED USING INCR OR DECR KEYS
IN EDIT BLOCK.
THE UPPER LIMIT MUST BE GREATER THAN LOWER LIMIT,
ELSE AN "ERROR-OVERLAPPING LIMITS" IS DISPLAYED
AND GRAPH DOTS ARE NOT DISPLAYED.

GRAPHED LABEL:

EXAMPLE:
    GRAPHED LABEL (A)

GRAPHED LABEL (F)

PURPOSE: TO SELECT A DEFINED LABEL A,B,C,D,E OR F TO BE
GRAPHED.

STATE COUNT OR TIME (ABS),(REL):

EXAMPLE:

| LABEL | A   | STATE COUNT |
|-------|-----|-------------|
| BASE  | HEX | DEC         |
|       |     | (ABS)       |
| SEQUENCE | 10 | = 1043    |
| SEQUENCE | 20 | = 1033    |
| SEQUENCE | 30 | = 1023    |
| START    | 40 |   0       |
| +01      | 60 | + 20      |
| +02      | 70 | + 30      |
| +03      | 71 | + 31      |
| .        | .  | .         |

| LABEL | A   | STATE COUNT |
|-------|-----|-------------|
| BASE  | HEX | DEC         |
|       |     | (REL)       |
| SEQUENCE | 10 |          |
| SEQUENCE | 20 | 10       |
| SEQUENCE | 30 | 20       |
| START    | 40 | 1023     |
| +01      | 60 | 20       |
| +02      | 70 | 10       |
| +03      | 71 | 1        |
| .        | .  | .        |

| LABEL | A   | TIME       |
|-------|-----|------------|
| BASE  | HEX | DEC        |
|       |     | (ABS)      |
| SEQUENCE | 10 | = 206.2 US |

|          |    |   |         |
|----------|----|---|---------|
| SEQUENCE | 20 | = | 200.2 US |
| SEQUENCE | 30 | = | 185.1 US |
| START    | 40 |   | .0 US |
| +01      | 60 | + | 80.6 US |
| +02      | 70 | + | 120.5 MS |
| +03      | 71 | + | 122.5 MS |
| .        | .  |   | . |

PURPOSE: TO VIEW TRACE LIST AND SELECT [ABS] OR [REL] FOR STATE COUNT OR TIME DATA.

COMMENTS: WHEN ABSOLUTE [ABS] IS SELECTED THEN STATE COUNT OR TIME IS DISPLAYED IN +/- ABSOLUTE VALUES WITH RESPECT TO START STATE 40. ALL STATES BEFORE START STATE 40 ARE SHOWN WITH "-" COUNT VALUES. START STATE 40 IS SHOWN AS ALWAYS 0. ALL STATES SHOWN AFTER START STATE 40 ARE SHOWN WITH "+" COUNT VALUES.
WHEN RELATIVE [REL] IS SELECTED, THEN STATE COUNT OR TIME IS DISPLAYED SHOWING COUNT VALUES RELATIVE TO PREVIOUS STATE COUNT VALUE (IF VALID) WITHOUT SIGN.

COUNT:

EXAMPLE:

| LABEL | A |
|-------|---|
| BASE  | HEX |

| COUNT [OFF]   |    |
|---------------|----|
| COUNT [STATE] | 7X |
| COUNT [TIME]  |    |

PURPOSE: TO SELECT COUNT MEASUREMENT TO BE [OFF], OR COUNT [STATE] OR COUNT [TIME].

COMMENT: WHEN COUNT IS [OFF], THE TRACE LIST DOES NOT SHOW COUNT DATA FOR THE NEXT TRACE MEASUREMENT.
WHEN COUNT [STATE] IS SELECTED, A 32 BIT COUNT OF SELECTED STATE 7X (70 TO 7F) IS STORED IN MEMORY WITH EACH POD DATA STATE STORED. THE RESULTANT COUNT DATA IS DISPLAYED IN TRACE LIST FOR NEXT TRACE MEASUREMENT.
WHEN COUNT [TIME] IS SELECTED, A COUNT VALUE OF TIME IS STORED FOR EACH POD DATA STATE STORED IN MEMORY. THE RESULTANT TIME DATA IN DISPLAYED IN TRACE LIST FOR NEXT TRACE MEASUREMENT.

COMPARED TRACE MODE:

EXAMPLE:

| LABEL    | A   | COMPARED   |
|----------|-----|------------|
| BASE     | HEX | TRACE MODE |
|          |     | [OFF]      |
| SEQUENCE | 00  |            |
| SEQUENCE | 00  |            |
| SEQUENCE | 00  |            |
| START    | 00  |            |
| +01      | 30  |            |
| +02      | 00  |            |

PURPOSE: TO SHOW THE "EXCLUSIVE OR" OF CURRENT DATA WITH STORED DATA. ALL 0'S IMPLIES SAME DATA IN BOTH FILES AND NON 0'S (30) SHOWS THAT DATA STATE DOES NOT COMPARE (BITS 4 AND 5, ASSUMING LSB IS BIT 0).

EXAMPLE:

| LABEL | A   | COMPARED   |
|-------|-----|------------|
| BASE  | HEX | TRACE MODE |
|       |     | [STOP=]    |

```
LABEL       A    COMPARED
BASE      HEX   TRACE MODE
                (STCP#)

PURPOSE: TO SELECT COMPARED TRACE MODE TO BE STOP WHEN EQUAL
         (STCP=), OR STOP WHEN NOT EQUAL (STCP#).

COMMENTS:  WHEN (STOP#) IS CHOSEN THE MEASUREMENT IS TRACED
           UNTIL VALID CURRENT DATA EQUALS (=) VALID STORED
           DATA. THE STATUS OF INSTRUMENT WILL BE:

"COMPARED TRACE-FAILED"

WHICH MEANS CURRENT DATA DOES NOT EQUAL STORED
           DATA. THE 1610A THEN TRACES AGAIN SHOWING:

"COMPARED TRACE-IN PROCESS"

AND COMPARES ANOTHER SET OF DATA. THIS PROCESS
           CONTINUES UNTIL:

"COMPARED TRACE-COMPLETE"

WHICH MEANS VALID CURRENT FILE EQUALS VALID STORED FILE
           DATA.
           A SIMILIAR OPERATION EXISTS FOR (STCP#), EXCEPT THIS
           MEASUREMENT CONTINUES UNTIL FILES DO NOT COMPARE.
           NOTE: THIS IS NOT A REAL TIME MEASUREMENT, BUT RATHER
           A "SAMPLED COMPARED MODE" THAT IS DEPENDENT IN PART
           UPON DATA CLOCK RATES, TRACE SPECIFICATION.
           THIS MEASUREMENT MODE MUST BE TURNED (OFF)
           TO OBTAIN SINGLE OR CONTINUOUS TRACE MODE.
```

We claim:

1. A method of indicating the existence of at least a minimum amount of activity of individual digital signals among a collection of digital signals, the method comprising the steps of:
    monitoring the individual digital signals to determine in accordance with preselected thresholds and polarities the logical value of each of the individual digital signals;
    periodically capturing the logical values of the individual digital signals determined by the monitoring step;
    comparing after each capturing step each set of newly captured logical values with the most recent previously captured set, each such comparison being between the old and new logical values for each of the individual digital signals, for producing a set of indications indicating which individual digital signals have a newly captured logical value that differs from the most recent previously captured corresponding logical value;
    combining after each comparing step the newest set of indications with a most recent cumulative result from previously combined previous sets of indications to provide a new cumulative result, the combining being the forming of the plurality of logical conjunctions between each individual value in the newest set of indications and the corresponding value in the most recent previous cumulative result and the subsequent taking of the outcome of each of those logical conjunctions as a corresponding portion of the new cumulative result; and
    displaying the cumulative result of the combining step in a series of annunciator locations each associated with an individual digital signal, each annunciator location displaying one of first and second indications respectively representing the two possible outcomes of each of the logical conjunctions of the combining step, thereby indicating which digital signals are experiencing a minimum amount of activity and which are not.

2. A method as in claim 1 wherein a fixed number n of periodically captured logical values are compared by the comparing step and combined by the combining step to produce a cumulative result reflecting that particular collection of n sampled logical values, whereupon a new cumulative result reflecting the next n captured logical values is begun.

3. Apparatus for indicating the existence of at least a minimum amount of activity of individual digital signals among a collection of digital signals, the apparatus comprising:
    input means coupled to receive the collection of digital signals, for performing signal conditioning thereon in accordance with preselected thresholds and polarities to produce a collection of logical signals each of which corresponds to a different one of the individual digital signals;
    sampling means coupled to the collection of logical signals for periodically capturing the values of the logical signals;
    comparison means coupled to the captured values of the logical signals, for comparing each newly captured set of such values with the most recent previously captured set of such values to produce an associated set of indicating signals indicating which individual digital signals have a newly captured logical value that differs from the most recent previously captured corresponding logical value;

combining means coupled to the indicating signals produced by the comparison means, for comparing each newest set of indicating signals and a most recent cumulative result from previous such comparisons, each comparison being a plurality of logical conjunctions between each individual value in the newest set of indicating signals and the corresponding value of the most recent previous cumulative result and the subsequent taking of the outcome of each of those logical conjunctions as a corresponding portion of the new cumulative result; and annunciator means coupled to the cumulative result of the combining means for displaying in a series of annunciator locations each associated with an individual digital signal one of first and second indications respectively representing the two possible outcomes of the logical conjunctions of the combining means, thereby indicating which digital signals are experiencing a minimum amount of activity and which are not.

4. Apparatus as in claim 3 wherein a fixed number n of periodically captured logical values are compared by the comparison means and combined by the combining means to produce a cumulative result reflecting that particular collection of n sampled logical values, whereupon a new cumulative result reflecting the next n captured logical values is begun.

* * * * *

UNITED STATES PATENT AND TRADEMARK OFFICE
CERTIFICATE OF CORRECTION

PATENT NO. : 4,293,925

DATED : October 6, 1981

INVENTOR(S) : George A. Haag et al

It is certified that error appears in the above—identified patent and that said Letters Patent is hereby corrected as shown below:

Column 1, line 19, after "4,040,025", insert --and is--;

Column 19, line 60, "provide" should be --produce--;

Signed and Sealed this

Twenty-ninth Day of December 1981

[SEAL]

Attest:

GERALD J. MOSSINGHOFF

Attesting Officer     Commissioner of Patents and Trademarks